United States Patent [19]

Yamada et al.

[11] Patent Number: 5,068,827
[45] Date of Patent: Nov. 26, 1991

[54] METHOD OF APPLYING A PROGRAM VOLTAGE FOR A NON-VOLATILE SEMICONDUCTOR MEMORY AND APPARATUS FOR IMPLEMENTING THE SAME

[75] Inventors: Seiji Yamada, Tokyo; Kiyomi Naruke, Yokohama, both of Japan

[73] Assignee: Kabushiki Kaisha Toshiba, Kawasaki, Japan

[21] Appl. No.: 448,358

[22] Filed: Dec. 11, 1989

[30] Foreign Application Priority Data

Jan. 20, 1989 [JP] Japan .................................. 1-11186

[51] Int. Cl.$^5$ ...................... G11C 11/40; G11C 13/00
[52] U.S. Cl. ............................ 365/189.01; 365/189.06
[58] Field of Search ............... 365/189.01, 182, 189.09, 365/230.01, 189.06

[56] References Cited

U.S. PATENT DOCUMENTS 4,964,081 10/1990 Birrittella et al. .............. 365/189.06

Primary Examiner—Terrell W. Fears
Attorney, Agent, or Firm—Foley & Lardner

[57] ABSTRACT

In a method of applying a voltage pulse for injecting-/extracting electrons into/from a non-volatile semiconductor memory in which high and low levels of a threshold voltage corresponding to presence and absence of storage of electrons are caused to correspond to binary information, the method includes the steps of generating a plurality of voltage pulses each having an ability of injecting or extracting only a portion of all electrons to be stored, and applying the plurality of voltage pulses to the non-volatile semiconductor memory to thereby carry out injection/extraction of all the electrons.

5 Claims, 5 Drawing Sheets

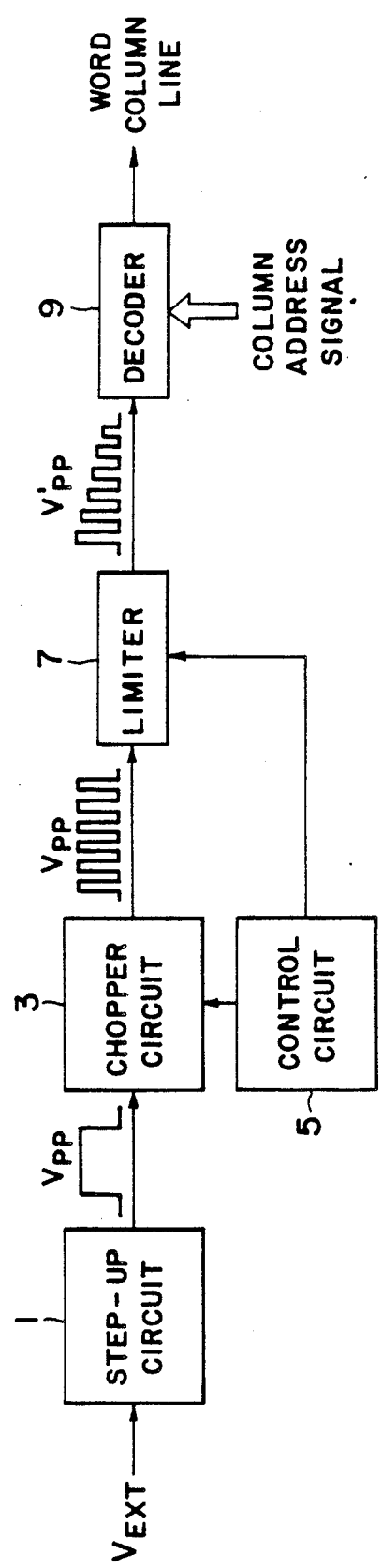
F I G. 3
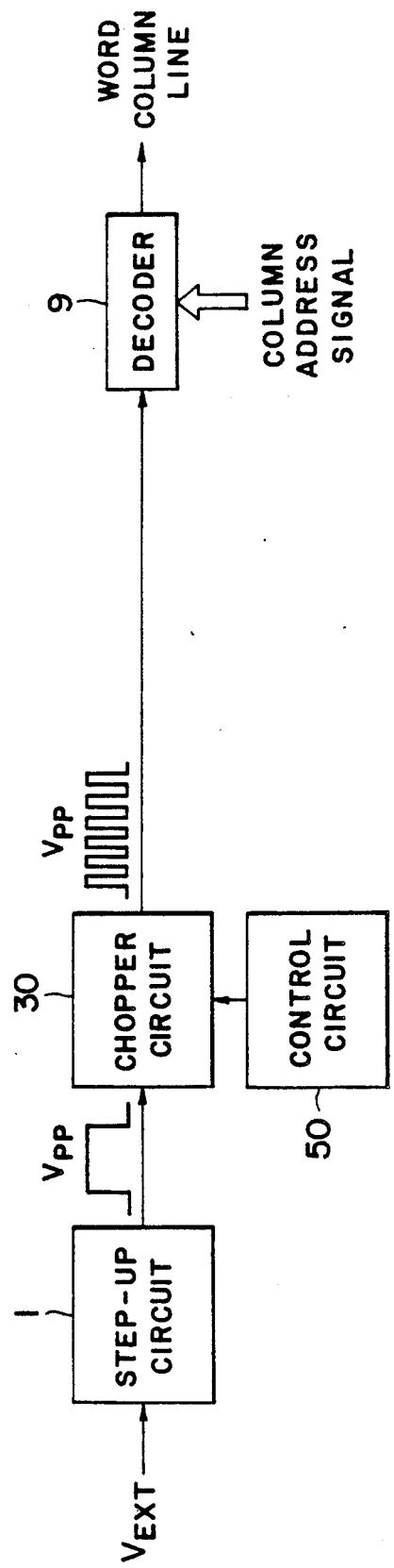
F I G. 5

METHOD OF APPLYING A PROGRAM VOLTAGE FOR A NON-VOLATILE SEMICONDUCTOR MEMORY AND APPARATUS FOR IMPLEMENTING THE SAME

BACKGROUND OF THE INVENTION

This invention relates to a method of applying a program voltage for an electrically erasable non-volatile semiconductor memory (EEPROM) and an apparatus for implementing the same, and more particularly to a method of applying a program voltage for a non-volatile semiconductor memory used in the case of carrying out injection of electrons into an interface level between a floating gate, or $SiO_2$ (silicon oxide) and $Si_3N_4$ (silicon nitride) or extraction therefrom by a Fowler-Nordheim current through an insulating film, and an apparatus for implementing the same.

Referring to FIG. 1, among EEPROMs of this type, there is shown a typical structure of a FLOTOX (floating-gate tunnel oxide) type EEPROM. Namely, on the substrate surface between the source S and the drain D, a stacked layer gate consisting of a control gate CG and a floating gate FG and a select gate SG are provided. At a portion of the insulating film OX below the floating gate FG, a tunnel insulating film TOX for permitting injection/extraction into/from the floating gate FG is provided.

The condition for applying a voltage to respective terminals in carrying out injection/extraction of electrons into/from the floating gate FG of the EEPROM of the structure as described above is shown in Table 1.

TABLE 1

|  | Control Gate | Select Gate | Drain | Source |
|---|---|---|---|---|
| Electron Extraction | GND | $V_{PP}$ | $V_{PP}$ | Open |
| Electron Injection | $V_{PP}$ | $V_{PP}$ | GND | Open |

In this instance, $V_{PP}$ is called a program voltage, which is set a value (e.g., approximately 15 to 20 V) higher than an applied voltage at the time of data read operation. In Table 1, in injecting electrons, a program voltage $V_{PP}$ is applied to the control gate CG and the select gate SG, the drain D is grounded, and the source is caused to be in an open state. On the other hand, in extracting electrons, a program voltage $V_{PP}$ is applied to the select gate SG and the drain D, the control gate CG is grounded, and the source S is caused to be in an open state.

By carrying out injection/extraction of electrons into/from the floating gate FG as stated above, a threshold value where the channel between the source S and the drain is turned on is changed. By such a change in the threshold value, discrimination between writing ("1") into the EEPROM and erasing ("0") the content thereof is conducted.

Meanwhile, a trapezoidal pulse which is blunt in rise (i.e., having a predetermined gradient) is used as the waveform of a program voltage $VG_{PP}$ applied in injecting electrons into the above-mentioned EEPROM and extracting them therefrom. FIG. 2A shows a waveform of a program voltage $V_{PP}$ used in the prior art. Ordinarily, its rise time is about 10 $\mu$s and its pulse width W is several ms.

When a trapezoidal pulse as shown in FIG. 2A is applied to the control gate CG, etc. as a program voltage, an electric field having a waveform as shown in FIG. 2B is produced in the tunnel oxide film TOX. Further, a Fowler-Nordheim current having a waveform approximate to a rectangular waveform as shown in FIG. 2C flows in the region of a fixed electric field indicated by slanting lines of the electric field waveform. Most of this Fowler-Nordheim current flows for a rise period of the control gate voltage shown in FIG. 2A. When the control gate voltage has reached the program voltage $V_{PP}$, injection/extraction of electrons are substantially completed.

When a Fowler-Nordheim current flows in the tunnel oxide film TOX, electrons flowing thereinto are subjected to impact ionization, thus to generate positive holes. A portion of holes generated in the tunnel oxide film TOX as stated above are subjected to recombination with electrons and extinguished. Remaining greater part of holes flow out toward the outside of the tunnel oxide film TOX by an electric field applied to the tunnel oxide film TOX. At this time, some holes remain at a trap level in the tunnel oxide film TOX with a fixed probability as they are. Such a phenomenon is called a trap of holes.

FIG. 2D shows density per unit volume of holes generated in the tunnel oxide film TOX as a result of the fact that a rectangular current pulse as shown in FIG. 2C, in a fixed electric field region as shown by slanting lines of FIG. 2B, flows in the tunnel oxide film TOX.

In FIG. 2D, the total number of electrons per unit volume is indicated by an area (a value obtained by integrating hole density in terms of time) defined by the abscissa and the curve. The value obtained by the value of the area by the probability where holes are trapped becomes equal to the total number per unit volume of holes trapped by one injection/extraction of holes. Every time injection/extraction into/from EEPROM is executed, holes trapped in the tunnel oxide film TOX are stored. When the number of holes stored exceeds above a certain limit, the tunnel oxide film TOX is subjected to dielectric breakdown. As a result, injection/extraction of electrons becomes impossible. This phenomenon gives a main cause determining the life time of a memory cell.

SUMMARY OF THE INVENTION

An object of this invention is to reduce the traps of holes in the tunnel oxide film in one injection/extraction into/from the floating gate, thereby prolonging a life time until the tunnel oxide film is subjected to dielectric breakdown.

This invention provides a method of applying a voltage pulse for carrying out injection/extraction of electrons into/from the non-volatile semiconductor memory in which high and low levels of a threshold voltage corresponding to storage of electrons are caused to correspond to binary information, the method comprises the steps of generating a plurality of voltage pulse each having an ability of injecting or extracting only a portion of all electrons to be stored, and applying the plurality of voltage pulses to the non-volatile semiconductor memory, thereby carrying out injection/extraction all the electrons.

Further, this invention provides an apparatus for applying a program voltage for a non-volatile semiconductor memory, which comprises means for generating a rectangular pulse having a predetermined voltage level and a predetermined width, means responsive to the rectangular pulse generated by the generation means to chop them into a plurality of pulses each having a narrow width, and means for delivering the plurality of pulses having a narrow width to a selected cell of the non-volatile semiconductor memory.

In accordance with the method according to this invention, a train of a plurality of voltage pulses are applied to the memory. A quantity of electrons injected or extracted by one voltage pulse is a portion of total quantity of electrons to be injected or extracted. Injection/extraction of all the electrons is attained by the plurality of voltage pulses. Since a pulse of the Fowler-Nordheim current caused to flow by one voltage pulse is short, the density of holes produced in the tunnel insulating film by such a current pulse is extremely small. As a result, the number of holes trapped by a plurality of Fowler-Nordheim current pulses caused to flow by a plurality of voltage pulses is smaller than that by the conventional method of carrying out injection/extraction of all electrons by one voltage pulse. Thus, the life time until the tunnel oxide film is subjected to dielectric breakdown is prolonged.

BRIEF DESCRIPTION OF THE DRAWINGS

In the accompanying drawings:

FIG. 3 is a block diagram of an apparatus for applying a program voltage for carrying out a first embodiment of a method according to this invention.

FIG. 5 is a block diagram of an apparatus for applying a program voltage for carrying out a second embodiment of a method according to this invention.

DESCRIPTION OF THE PREFERRED EMBODIMENTS

Figure 1:
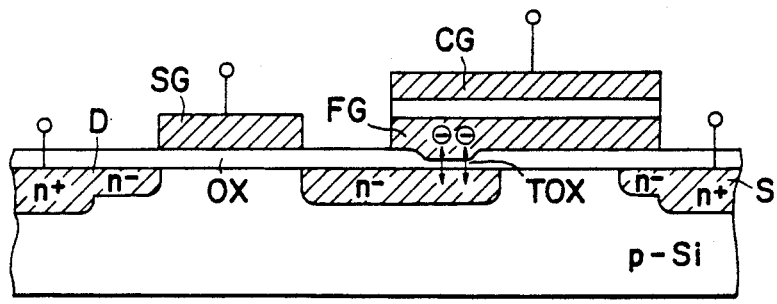
FIG. 1 is a cross sectional view showing a typical structure of a FLOTOX type EEPROM.

Preferred embodiments of this embodiment will be described with reference to the attached drawings.

FIG. 3 is a block diagram showing a circuit configuration of an apparatus for applying a program voltage for an EEPROM in accordance with a first embodiment of this invention.

In FIG. 3, a step-up circuit 1 steps up a given external voltage $V_{EXT}$ (e.g., a power supply voltage of 5 V) to a predetermined program voltage $V_{PP}$ (e.g., 15 to 20 V) to generate and output a rectangular pulse signal having the voltage $V_{PP}$. A chopper circuit 3 chops the rectangular pulse signal outputted from the step-up circuit 1 into a train of an N number (plurality) of pulse signals having a predetermined width (narrow width) by a time control signal outputted from a control circuit 5. A limiter 7 is of a structure comprising an N number of limiter elements connected in parallel, and these N limiter elements connected in parallel have limit values different from each other, respectively. Time constant circuits for allowing pulse signals outputted from these limiter elements to have predetermined gradients are assembled into the N limiter elements, respectively. The limiter 7 is constructed so that the N limiter elements connected in parallel are selectively driven in sequence in synchronism of an output timing of the pulse from the chopper circuit 3. In that case, the limiter element having the lowest limit value is first driven in correspondence with a first pulse signal outputted from the chopper circuit 3. Then, the limiter element having a limit value set to a low value next to the first limit value is secondly driven in correspondence with a pulse signal outputted secondly. Such an operation is sequentially executed. Thus, the limiter element having the highest limit value is finally driven in correspondence with a pulse signal outputted in the N-th place. In this example, the highest limit value is set to the program voltage $V_{PP}$. The limiter 7 performs an operation to output a train of N pulses such that the peak value rises stepwise from that of the first pulse up to that of the N-th pulse, which is equal to the program voltage $V_{PP}$.

A decoder 9 delivers, to a word column line of the EEPROM selected by a column address externally given, N pulses outputted from the limiter 7.

A method of applying a program voltage for EEPROM using the apparatus described above will now be described mainly with reference to FIGS. 4A to 4D.

Figure 2A:
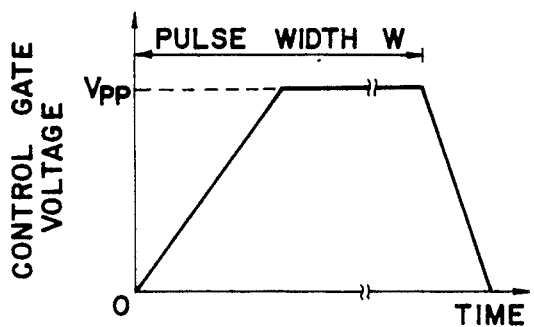
FIGS. 2A, 2B, 2C and 2D are waveform diagrams showing an applied voltage, a tunnel oxide film electric field, a Fowler-Nordheim current, and a hole density in a conventional method, respectively.
Figure 4A:
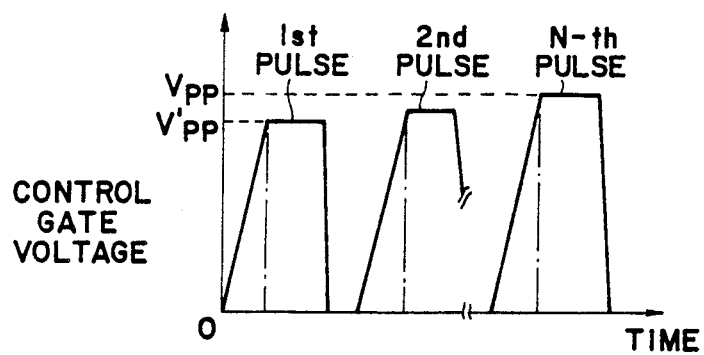
FIGS. 4A, 4B, 4C and 4D are waveform diagrams showing an applied voltage, a tunnel oxide film electric field, a Fowler-Nordheim current, and a hole density in the first embodiment of a method according to this invention, respectively.

A train of N stair-stepped voltage pulses generated through the step-up circuit 1, the chopper gate 3 and the limiter 7 which are shown in FIG. 3 are applied to a terminal to which a program voltage $V_{PP}$ shown in Table 1 of a memory cell selected by a column address and a row address is to be applied. The waveforms of the train of N voltage pulses are shown in FIG. 4A. Namely, the first voltage pulse has a peak value set to a value $V'_{PP}$ lower than the peak value of the program voltage $V_{PP}$, and the second voltage pulse has a peak value set to a value slightly higher than the peak value $V'_{PP}$ of the first voltage pulse. The N-th voltage pulse has a peak value equal to the program voltage $V_{PP}$. Rises of these N voltage pulses are set considerably steep as is clear from the comparison with FIG. 2A showing the waveforms of the voltage pulses in accordance with the prior art.

Figure 2B:
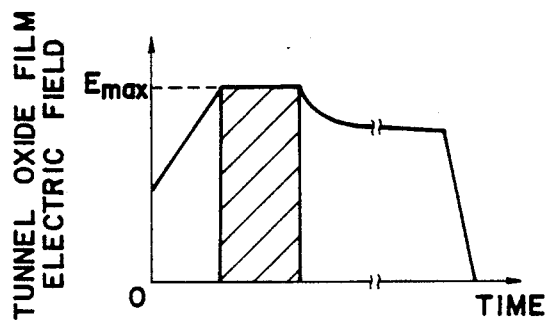
Figure 2C:
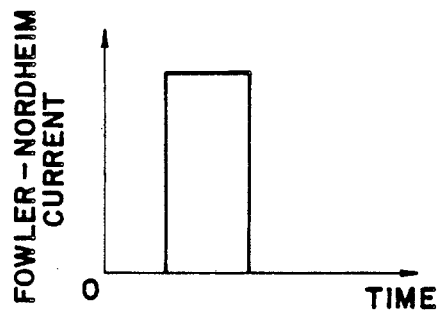
Figure 4B:
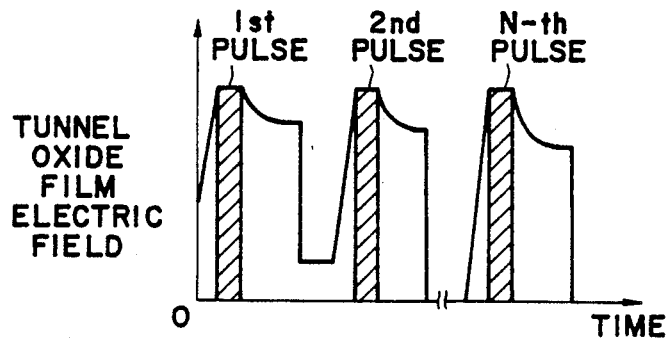
Figure 4C:
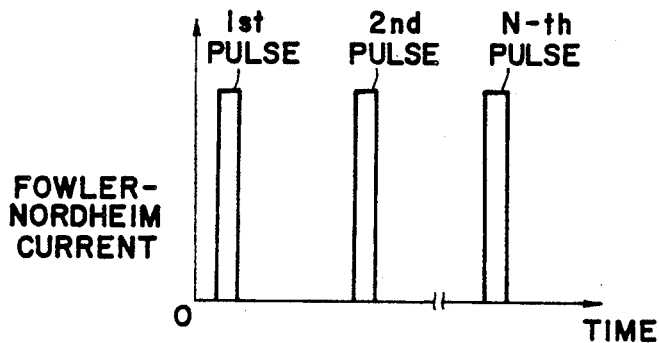

By suitably setting the peak values and the rise times of respective voltage pulses, an electric field having the same strength as that of the tunnel oxide film electric field (region indicated by slanting lines in FIG. 2B) in accordance with the prior art and having a short pulse width in terms of time is formed as shown in FIG. 4B during a rise period of respective voltage pulses. At this time, a Fowler-Nordheim current having the same value as the Fowler-Nordheim current (FIG. 2C) in accordance with the prior art and having a short pulse width flows in the tunnel oxide film TOX as shown in FIG. 4C. A sum of pulse widths of N short current pulses shown in FIG. 4C is in correspondence with the pulse width of the current pulse in accordance with the prior art shown in FIG. 2C. Namely, in this embodiment, injection/extraction of electrons is carried out by N short Fowler-Nordheim current pulses obtained by dividing, in terms of time, a single Fowler-Nordheim current in accordance with the prior art.

Figure 2D:
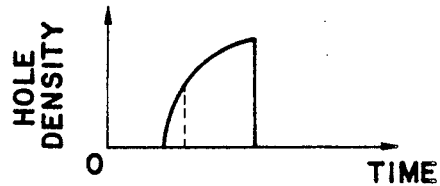
Figure 4D:
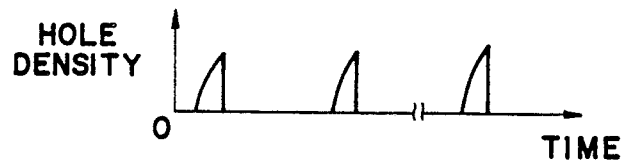

The density of holes produced in the tunnel oxide film TOX by respective current pulses shown in FIG. 4C is shown in FIG. 4D. The respective waveforms become in correspondence with the waveforms of the initial portion of the rise indicated by broken lines in the waveforms in FIG. 2D showing the conventional hole density. As is clear when reference is made to FIG. 2D, the density of holes in the tunnel oxide film TOX is small when the Fowler-Nordheim current begins flowing under the condition of a fixed electric field, and gradually increases with the passage of time. When the time width of the Fowler-Nordheim current pulse is shortened as in this embodiment, a Fowler-Nordheim current will flow in a region where the hole density is small at all times. Accordingly, as compared to the case where a Fowler-Nordheim current is caused to flow as a single current pulse having a broad time width as in the prior art, the total number of holes with respect to the same quantity of the Fowler-Nordheim current as above can be reduced to much degree. This is also apparent by making a comparison between the sum of areas of N waveforms of FIG. 4D and the area of the waveform of FIG. 2D. As a result, the number of holes trapped is also reduced to much degree. Thus, the life time of the memory cell is greatly prolonged.

It is to be noted that while it has been described in this embodiment that a voltage pulse of a trapezoidal wave is applied to the control gate CG and the select gate, etc., a voltage pulse of a triangular wave may be applied thereto in place of the voltage pulse of the trapezoidal wave.

FIG. 5 is a block diagram showing a circuit configuration of an apparatus for applying a program voltage for EEPROM in accordance with a second embodiment of this invention.

In the apparatus for applying the program voltage, limiter 7 is removed from the apparatus for applying the program voltage in accordance with the first embodiment shown in FIG. 3. A control circuit 50 delivers, to a chopper circuit 30, a time control signal extremely faster than that in the control circuit 5 of FIG. 3. Thus, the chopper circuit 30 chops, at a high speed, a rectangular pulse from the step-up circuit 1 to generate M voltage pulses of an extremely short time width (e.g., about several μs). The chopper circuit 30 sets rise times of respective chopped voltage pulses to a predetermined extremely steep value (e.g., about 1 μs). Such a train of M extremely short voltage pulses are outputted onto a selected word column line through the decoder 9. When consideration is taken into the fact that the rise time and the pulse width of the voltage pulse in accordance with the prior art are several 10 μs and several ms, respectively, it is apparent that the rise time and the pulse width of the voltage pulse in accordance with this embodiment are set to extremely short values, respectively.

Figure 6A:
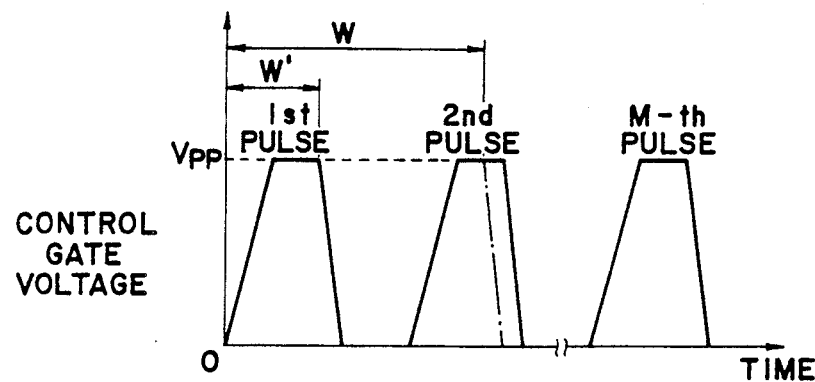
FIGS. 6A, 6B, 6C and 6D are waveform diagrams showing an applied voltage, a tunnel oxide film electric field, a Fowler-Nordheim current, and a hole density in the second embodiment of the method according to this invention, respectively.

The waveforms of the train of M voltage pulses generated by the apparatus shown in FIG. 5 are shown in FIG. 6A. In the case where such a voltage pulse having an extremely steep rise is applied, as shown by hatched portions of the first pulse taken as an example, a Fowler-Nordheim current flows not only for a time period of a fixed electric field within a rise period of the voltage pulse, but also, to a non-negligible degree, for a time period during which an electric field is lowered after the voltage pulse has risen. If the first pulse has a sufficiently broad width as indicated by single dotted lines in FIG. 6A, a Fowler-Nordheim current of which waveform is indicated by single dotted lines in FIG. 6C flows. As a result, the total quantity of that current becomes equal to the total quantity of Fowler-Nordheim current in accordance with the prior art shown in FIG. 2C. However, since the pulse width of each voltage pulse is set to an extremely short value (W') as shown in FIG. 6A, the Fowler-Nordheim current is cut at the back end of the hatched region of FIG. 6C corresponding to the hatched region of FIG. 6B.

Figure 6B:
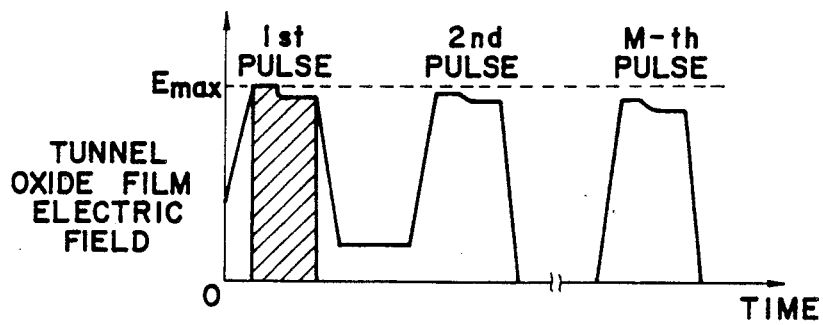
Figure 6C:
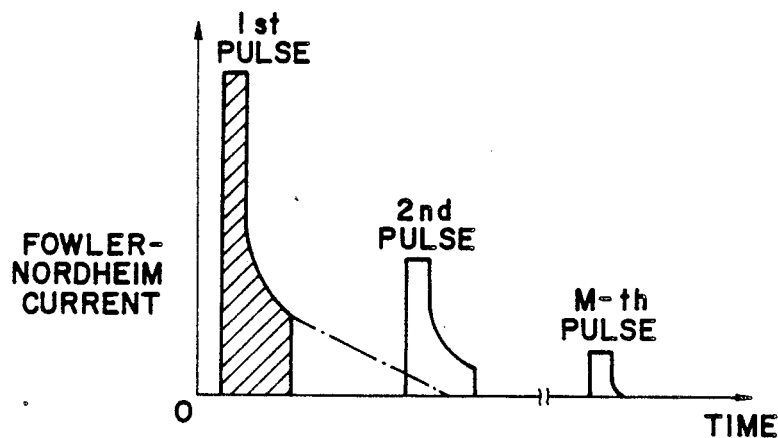

The peak value of the second voltage pulse is set to $V_{PP}$ equal to the peak value of the first voltage pulse. Thus, as shown in FIG. 6B, the strength of an electric field produced in the tunnel oxide film TOX is equal to a value slightly lower than the peak value Emax of the electric field produced in the tunnel oxide film when the first pulse is applied. This is because the strength of the tunnel oxide film electric field is lowered by a value corresponding to the quantity of electrons injected by the first pulse. As apparent when reference is made to FIG. 6C, the quantity of a Fowler-Nordheim current flowing by the second voltage pulse is reduced to much degree as compared to that by the first current pulse in correspondence with lowering of the tunnel oxide film electric field.

Thus, in order of occurrence voltage pulses, Fowler-Nordheim currents flowing by such respective pulses become smaller values accordingly. The total quantity of the first to the M-th current pulses is equal to the quantity of the Fowler-Nordheim current (single dotted line in FIG. 6C) when a single voltage pulse of $V_{PP}$ having a pulse width W and a peak value $V_{PP}$ is applied.

Figure 6D:
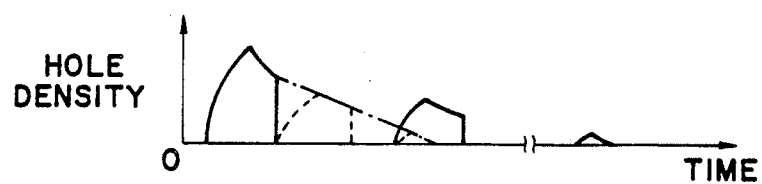

FIG. 6D shows the density of holes produced in the tunnel oxide film by such Fowler-Nordheim current pulses. If a voltage pulse having a broad time width W as indicated by single dotted lines in FIG. 6A is applied, the density of holes is as indicated by single dotted lines in FIG. 6D. On the contrary, when M voltage pulses having an extremely short time width W' are applied as in this embodiment, the density of holes is as indicated by the solid line. The waveforms of the second pulse and pulses succeeding thereto shown by solid lines in FIG. 6D are in correspondence with respective waveforms of the portions shown by broken lines in the waveform indicated by single dotted lines in FIG. 6D. When comparison between the densities of holes in these two cases is made, it is apparent that the density of holes of the latter is held down to a value smaller than that of the former. Accordingly, it is made clear that the number of holes trapped is reduced, resulting in a prolonged life time of the cell.

While reduction in the number of holes trapped in this embodiment is slightly inferior to that in the above-mentioned first embodiment, the number of holes trapped can be still reduced to much degree as compared to that in the prior art. In addition, this embodiment can advantageously remove the limiter 7 of FIG. 3 which is complicated in construction and requires a complicated and difficult control, resulting in realization of miniaturized apparatus.

It is to be noted that while it has been described in the embodiments that a voltage pulse of a trapezoidal wave is applied to the control gate CG and the select gate SG, etc., a voltage pulse of a triangular wave may be applied thereto in place of such a voltage pulse of trapezoidal wave in order to obtain more conspicuous advantages.

Further, while the pulse waveforms shown in FIGS. 4A and 6A rise linearly, it is not necessarily required that such waveforms are linear as long as they are a monotonous increasing pulse waveform.

In addition, the apparatus for applying a program voltage shown in FIGS. 3 and 5 may be formed in the same IC as EEPROM, or may be formed in an IC different from EEPROM.

Figure 7:
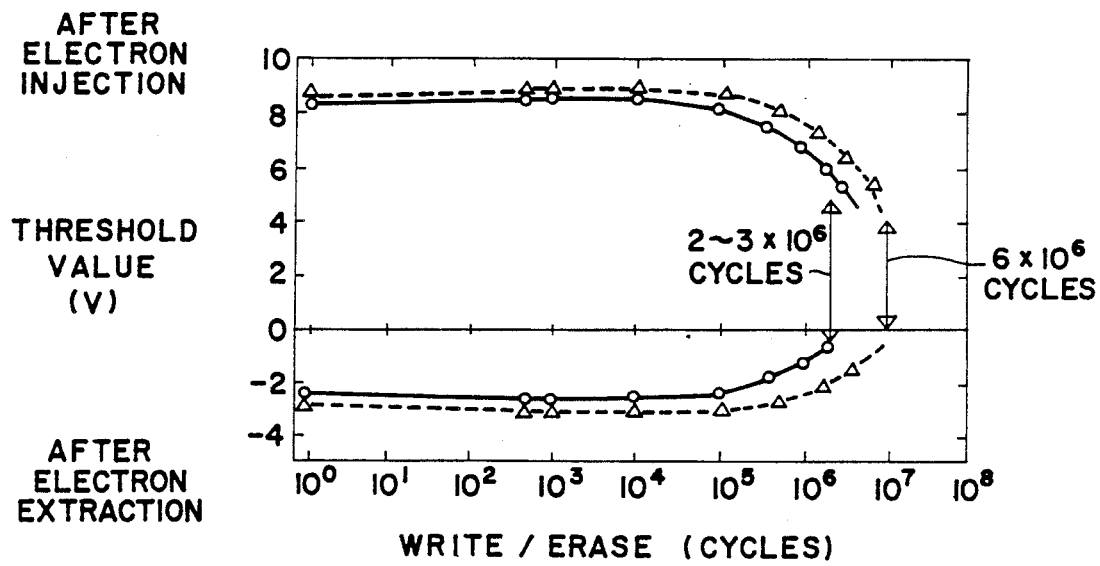
FIG. 7 is a characteristic diagram showing, in a comparative manner, an endurance test characteristic of a tunnel oxide film when injection/extraction of electrons is repeatedly executed by the second embodiment of the method according to this invention and an endurance test characteristic of a tunnel oxide film when injection/extraction of electrons is repeatedly executed by the conventional method.

FIG. 7 is a characteristic diagram showing, in a comparative manner, the endurance test characteristic of a tunnel oxide film when injection/extraction is repeatedly executed using a single voltage pulse in accordance with the prior art and the endurance test characteristic when injection/extraction of electrons is repeatedly executed using a plurality of voltage pulses in accordance with a second embodiment of this invention.

As is apparent when reference is made to FIG. 7, where measurement is started with an initial threshold window (difference between threshold values of the channel when viewed from the control gate CG at the time of injection of electrons and at the time of extraction thereof), narrowing of the threshold window in accordance with this invention is more gentle than that in the prior art, and the number of programming operations until the breakdown of the tunnel oxide film in accordance with this invention is increased up to $6 \times 10^6$ to much degree as compared to the number of programming operations of 2 to $3 \times 10^6$ in accordance with the prior art. Namely, in accordance with this invention, it is apparent from FIG. 7 that the reliability of the memory cell can be improved and life time can be prolonged to much extent.

The scope of this invention is not limited to the above-described embodiments, but may be modified diversely within the scope of the gist thereof.

What is claimed is:

1. A method of applying a voltage pulse for carrying out the injection/extraction of electrons into/from a non-volatile semiconductor memory in which high and low levels of a threshold voltage corresponding to the presence and absence of the storage of the electrons are caused to correspond to binary information, the method comprising the steps of:
generating a plurality of voltage pulses, each pulse ejecting or extracting only a portion of all electrons to be stored;
causing each of the plurality of voltage pulses to rise steeply so that a Fowler-Nordheim current flows to a non-negligible degree even after each pulse has risen, and wherein each voltage pulse is caused to have a sufficiently short pulse width, so as to interrupt in the course of its fall the Fowler-Nordheim current flowing after completion of the rise; and
applying the plurality of voltage pulses to the non-volatile semiconductor memory to thereby inject or extract all of the electrons.

2. A method as set forth in claim 1, wherein the plurality of voltage pulses are such that their respective peak values gradually rise in order of occurrence thereof.

3. A method of applying a voltage pulse for carrying out the injection/extraction of electrons into/from a non-volatile semiconductor memory in which high and low levels of a threshold voltage corresponding to the presence and absence of the storage of electrons are caused to correspond to binary information, the method comprising the steps of:
generating a plurality of rectangular voltage pulses, each pulse having a predetermined voltage level and a predetermined width,
chopping each rectangular pulse generated by the generating means to form narrow pulses, the narrow pulses each having the ability of interjecting or extracting only a portion of all electrons to be stored; and
applying the plurality of voltage pulses to the non-volatile semiconductor memory, thereby to inject or extract all of the electrons.

4. An apparatus as set forth in claim 3, including limiter means provided between the chopper means and the supply means, and responsive to the plurality of narrow pulses from the chopper means, thus to limit voltage levels of the respective pulses so that the voltage levels gradually rise in order of occurrence of the pulses.

5. An apparatus as set forth in claim 3, wherein the chopper means allows each narrow pulse to rise steeply so that a Fowler-Nordheim current flows into the selected cell to a non-negligible degree even after each pulse has risen, and allows each narrow pulse to have a sufficiently short pulse width so as to interrupt, in the course of its fall, the Fowler-Nordheim current flowing after the completion of the rise.

* * * * *